: US 7,504,906 B2
(12) United States Patent
Chu

(10) Patent No.: US 7,504,906 B2
(45) Date of Patent: Mar. 17, 2009

(54) METHOD FOR MANUFACTURING AN EQUALIZER

(75) Inventor: Cheng-Hui Chu, Taipei (TW)

(73) Assignee: Inventec Corporation, Taipei (TW)

( * ) Notice: Subject to any disclaimer, the term of this patent is extended or adjusted under 35 U.S.C. 154(b) by 89 days.

(21) Appl. No.: 11/882,542

(22) Filed: Aug. 2, 2007

(65) Prior Publication Data

US 2009/0034600 A1    Feb. 5, 2009

(51) Int. Cl.
*H04B 3/00*    (2006.01)
*H04B 3/04*    (2006.01)
*H04B 3/14*    (2006.01)

(52) U.S. Cl. ............... 333/28 R; 333/18; 333/19

(58) Field of Classification Search ........... 333/28 R, 333/18, 123, 19

See application file for complete search history.

(56) References Cited

U.S. PATENT DOCUMENTS 6,927,645 B2 *    8/2005    Errington ............... 333/28 R

* cited by examiner

*Primary Examiner*—Benny Lee
*Assistant Examiner*—Gerald Stevens
(74) *Attorney, Agent, or Firm*—Muncy, Geissler, Olds & Lowe PLLC

(57) ABSTRACT

A method for manufacturing an equalizer. The method first acquires a transmission line scattering-parameter, and a gain of the transmission line scattering-parameter at a frequency $$\frac{1}{\pi\tau},$$

in which the gain represents an ideal gain; next, performs an integration about the transmission line scattering-parameter, the ideal gain and an equalizer scattering-parameter, and performs a differentiation about the transmission line scattering-parameter and the equalizer scattering-parameter to get the component impedances of the equalizer. Then manufacture the equalizer circuit with the derived component impedances.

11 Claims, 5 Drawing Sheets

METHOD FOR MANUFACTURING AN EQUALIZER

BACKGROUND

1. Field of Invention

The present invention relates to a manufacturing method of an equalizer. More particularly, the present invention relates to a manufacturing method of a transmission line equalizer.

2. Description of Related Art

Signal gain losses caused by transmission lines become a major cause of signal gain losses when the working frequency increases. To prevent signal distortion due to the signal gain losses caused by the transmission lines, a passive equalizer is used to compensate for the gain losses at high frequency.

The passive equalizer is composed of passive components such as resistors, inductors, and capacitors. The passive equalizer operates as a high pass filter while the transmission lines operate as low pass filters. Therefore, the spectrum of signal transmitted by the transmission line and the equalizer approximates the spectrum of the original signal before transmitted, which reduces the signal distortion.

However, the conventional manufacturing method of the passive equalizer is not an effective way to predict the component impedances which can compensate for the signal losses more accurately. In the conventional way, various component impedances are tried and simulated to derive suitable component impedances. The method wastes human resources and is not able to compensate for the signal losses accurately.

For the foregoing reasons, there is a need for a new method to manufacture the equalizer more effectively and compensate for the signal more accurately.

SUMMARY

According to an embodiment of the present invention, the method for manufacturing an equalizer used to compensate an output signal of a transmission line is disclosed. The equalizer is electrically connected to the transmission line, and a period signal with a 2τ period is transmitted through the transmission line and the equalizer. The method first acquires a transmission line scattering-parameter, and a gain of the transmission line scattering-parameter at a frequency of $$\frac{1}{\pi\tau},$$

in which the gain represents the ideal gain.

Next, performs an integration about the transmission line scattering-parameter, the ideal gain and an equalizer scattering-parameter, and performs a differentiation about the transmission line scattering-parameter and the equalizer scattering-parameter to get the component impedances of the equalizer. Then the equalizer circuit is manufactured with the derived component impedances.

It is to be understood that both the foregoing general description and the following detailed description are by examples, and are intended to provide a further explanation of the invention as claimed.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1:
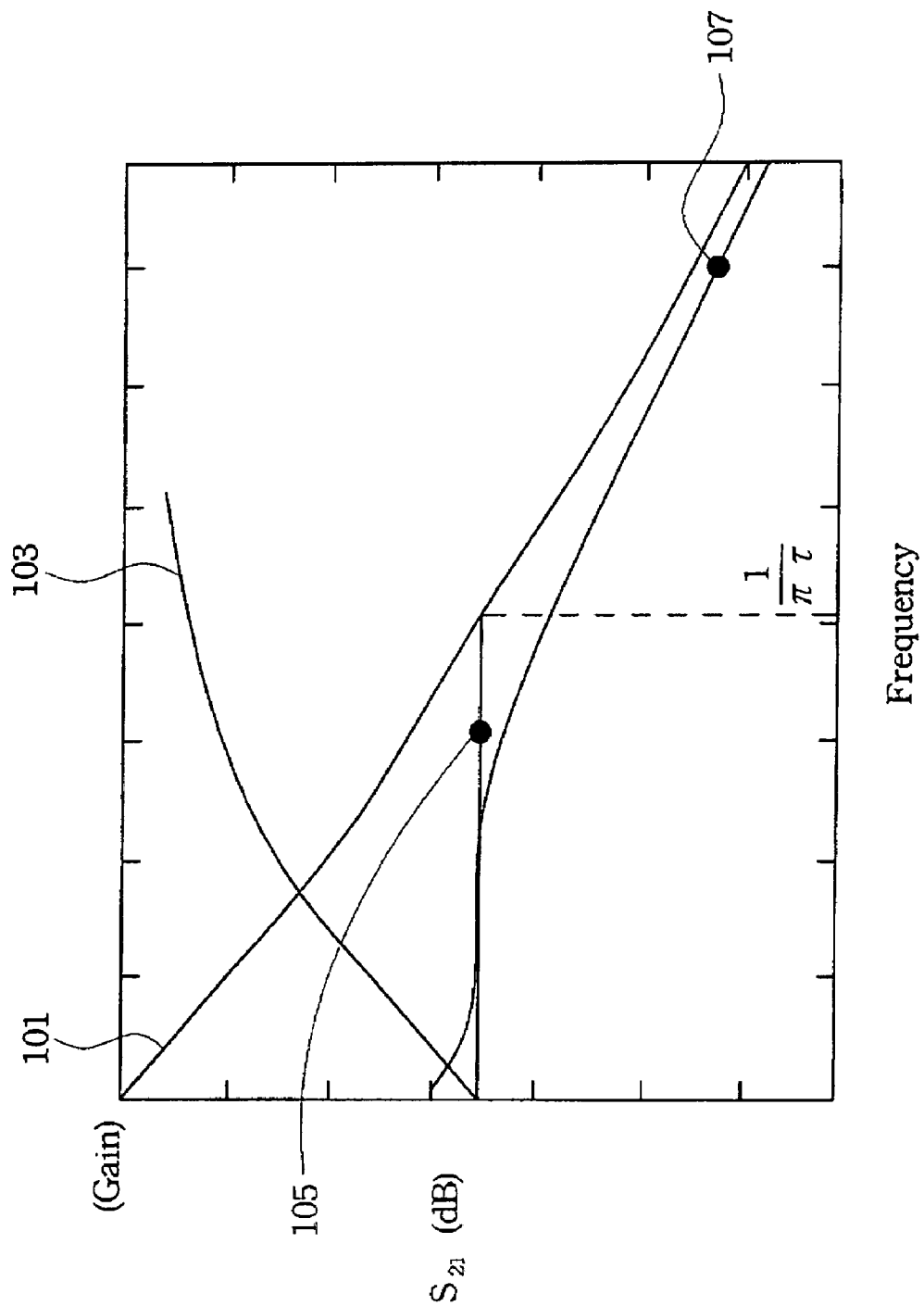
FIG. 1 shows the frequency response of the transmission line and the equalizer according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

The method for manufacturing the equalizer according to the embodiment shown below can improve the manufacturing flow of the equalizer and reduce the unnecessary circuit simulation; still, the method can compensate the signal losses caused by the transmission line more accurately.

FIG. 1 shows the frequency response of the transmission line and the equalizer according to one embodiment of the present invention. In FIG. 1, a period signal with a 2τ period is transmitted through the transmission line. The transmission line scattering-parameter 101 decreases as the frequency increases, which means that the transmission line operates like a low pass filter. The gain of the transmission line scattering-parameter 101 at a frequency $$\frac{1}{\pi\tau}$$

represents the ideal gain 105. The equalizer scattering-parameter 103 varies with the component impedances of the equalizer. The output signal gain 107 is influenced by both the gain of the transmission line scattering-parameter 101, and the gain of the equalizer scattering-parameter 103. In other words, tuning the component impedances of the equalizer can make the compensated output signal gain 107 approach the ideal gain 105 at a frequency less than $$\frac{1}{\pi\tau}.$$

Figure 2:
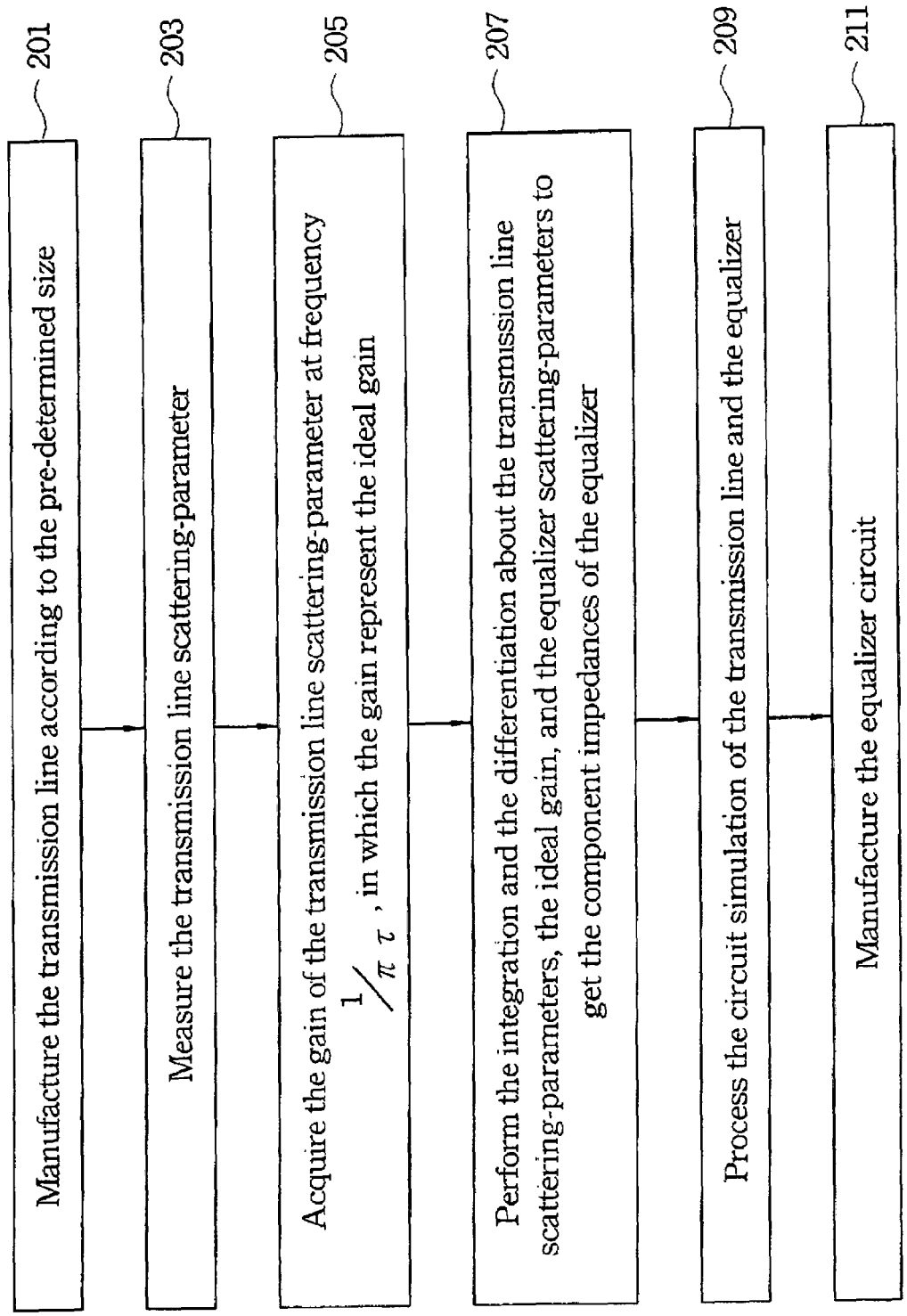
FIG. 2 shows the manufacturing flow of the equalizer according to one embodiment of the present invention.

FIG. 2 shows the manufacturing flow of the equalizer according to one embodiment of the present invention. In the beginning, the transmission line is manufactured according to the pre-determined size (step 201), in which the transmission line scattering-parameter varies with different transmission lines sizes. Next, in step 203, the vector network analyzer measures the transmission line scattering-parameter. Then in step 205, the gain of the transmission line scattering-parameter is measured at a frequency $$\frac{1}{\pi\tau}.$$

The gain represents the ideal gain.

After acquiring the transmission line scattering-parameters and the ideal gain, a software, such as Matlab, performs an integration about the transmission line scattering-parameter, the ideal gain and an equalizer scattering-parameter, and also performs a differentiation about the transmission line scattering-parameter and the equalizer scattering-parameter to get the component impedances of the equalizer (step 207).

The integration $$\int_0^\infty |(H_{TX-Line}(f) \times H_{equalizer}(f))| - H_{ideal}(f)| df = \min$$

selects the component impedances which makes the gain of the compensated output signal approach the ideal gain. The $H_{TX-Line}(f)$ represents the transmission line scattering-parameter. The $H_{ideal}(f)$ represents the ideal gain. The $H_{equalizer}(f)$ represents the equalizer scattering-parameter, and the min represents the minimum positive number. The differentiation $$\frac{d\{20\log_{10}\lfloor H_{TX-Line}(f) \times H_{equalizer}(f)\rfloor\}}{df} \le 0$$

further selects the component impedances which makes the slope of the output signal gain fixed or less than zero at a frequency less than $$\frac{1}{\pi\tau}.$$

Although the integration is able to derive the component impedances which make compensated output signals approach the ideal gain, if only the integration is performed, the gain of the output signal might still have a maximum value and a minimum value (peak value) at a frequency less than $$\frac{1}{\pi\tau}.$$

In other words, with only the integration, the gain of the output signal might not be monotonically decreasing. Therefore, the differentiation is needed to select the component impedances which can make the compensated output signal gain decrease monotonically.

In step 209, after the component impedances of the equalizer have been derived, a circuit simulation of the transmission line and the equalizer identifies the outcome of the compensation. That is, checks if the waveform of the output signal, compensated by the equalizer, is similar to the waveform of the original signal (The original signal means the signal hasn't been transmitted by the transmission line). Afterward, in step 211, the equalizer circuit is manufactured with the derived component impedances.

Figure 3:
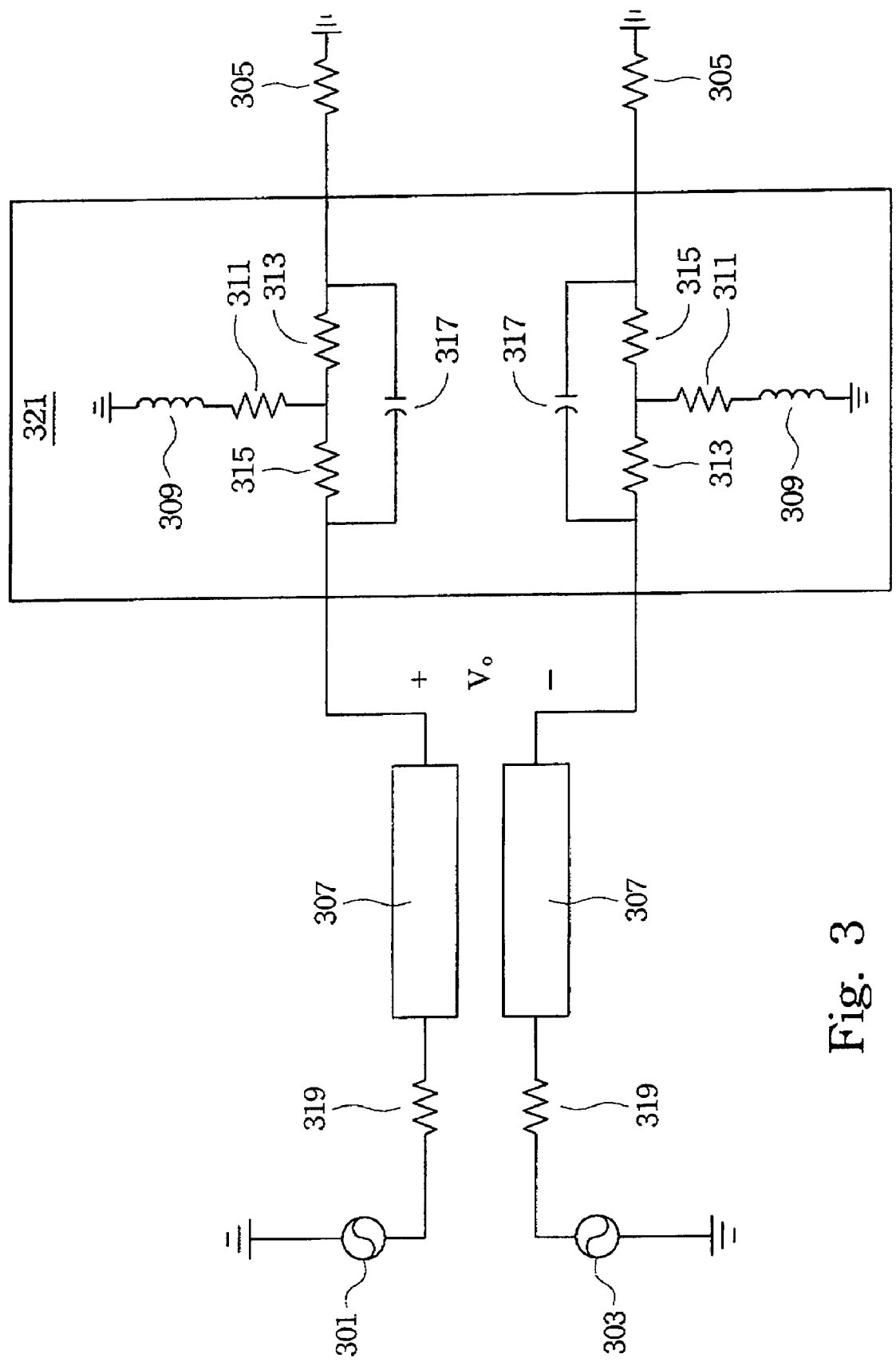
FIG. 3 shows the circuit of the transmission line and the equalizer according to one embodiment of the present invention.

FIG. 3 shows the circuit of the transmission line and the equalizer according to one embodiment of the present invention. The equalizer 321 is electrically connected to the transmission line 307, while the load 305 is electrically connected to the equalizer 321. In this embodiment, the load 305 is a resistor with a 50Ω resistance, and the resistance of the resistor 319 is 50Ω, too.

The differential signals 301 and 303 are transmitted to the equalizer 321 through the resistors 319 and the transmission lines 307. The equalizer 321 includes capacitors 317, the inductors 309, the resistors 311, the resistors 313, and the resistors 315. The inductors 309 are electrically connected to one ends of the resistors 311. The resistors 313 and the resistors 315 are electrically connected to the other ends of the resistors 311 and the capacitors 317.

To derive the component resistances of the equalizer 321, the reflection scattering-parameters $S_{11}$ and $S_{22}$ are first set to zero to get the equation $L_e = Z_0^2 C_e$, and the equation $R_1^2 + 2R_1R_2 = Z_0^2$. Besides, the equalizer scattering-parameter is $$H_{equalizer}(f) = \frac{\frac{Z_0}{R_1} - 1 + 2j\sqrt{L_e C_e}\,\omega}{\frac{Z_0}{R_1} + 1 + 2j\sqrt{L_e C_e}\,\omega}.$$

The $R_1$ the $R_2$ and the $Z_0$ represent the resistances of the resistor 313, the resistor 311, and the load 305 respectively. The $L_e$ and the $C_e$ represent the impedance of the inductor 309 and the capacitor 317. Next, the equalizer scattering-parameter $H_{equalizer}(f)$, the transmission line scattering-parameter $H_{TX-Line}(f)$, and the ideal gain $H_{ideal}(f)$ are integrated and differentiated as stated above by the software to derive the component impedances. As a result of the integration and the differentiation, the resistances of the resistor 313 and the resistor 315 are both 20Ω, the inductance $L_e$ of the inductor 309 is 10 nH, and the capacitance $C_e$ of the capacitor 317 is 4 pf. Then, substitute the $R_1$ and the $Z_0$ with 20Ω and 50Ω respectively into the equation $R_1^2 + 2R_1R_2 = Z_0^2$ to get resistance $R_2$ of the resistor 311 is 52.5Ω.

Figure 4:
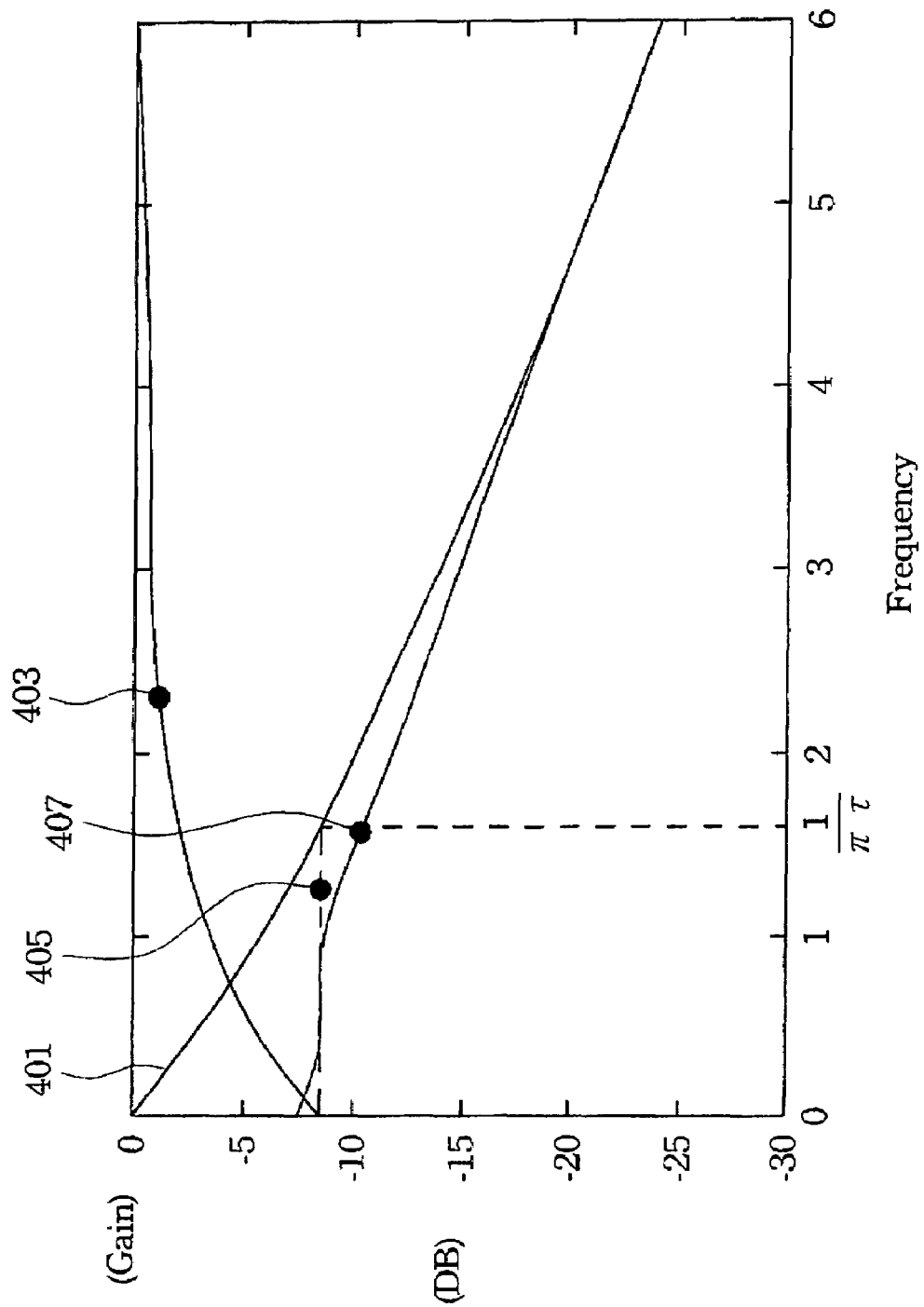
FIG. 4 shows the frequency response of the compensated output signal of the transmission line according to one embodiment of the present invention.

Please refer to both FIG. 3 and FIG. 4. FIG. 4 shows the frequency response of the compensated output signal of the transmission line according to one embodiment of the present invention. In FIG. 4, the gain of the transmission line scattering-parameter 401 at a frequency $$\frac{1}{\pi\tau}$$

represents the ideal gain 405. The gain of the equalizer scattering-parameter 403 increases as the frequency increases. The output signal gain 407 represents the gain of the output signal $V_0$ (which has been compensated by the equalizer 321) shown in FIG. 3.

After the component impedances of the equalizer 321 have been derived, the differential signals 301, 303 with 800 mv voltage and 5 Gbps frequency (200 ps period) are transmitted to the transmission lines 307 for simulation. Then simulate the signals of the transmission line and the equalizer that has the derived component impedance. According to the Eye diagram of the compensated output signal $V_0$ derived by the circuit simulation, the eye height (voltage) and the eye width (time) of the compensated output signal $V_0$ are 230 mv and 170 ps respectively.

Figure 5:
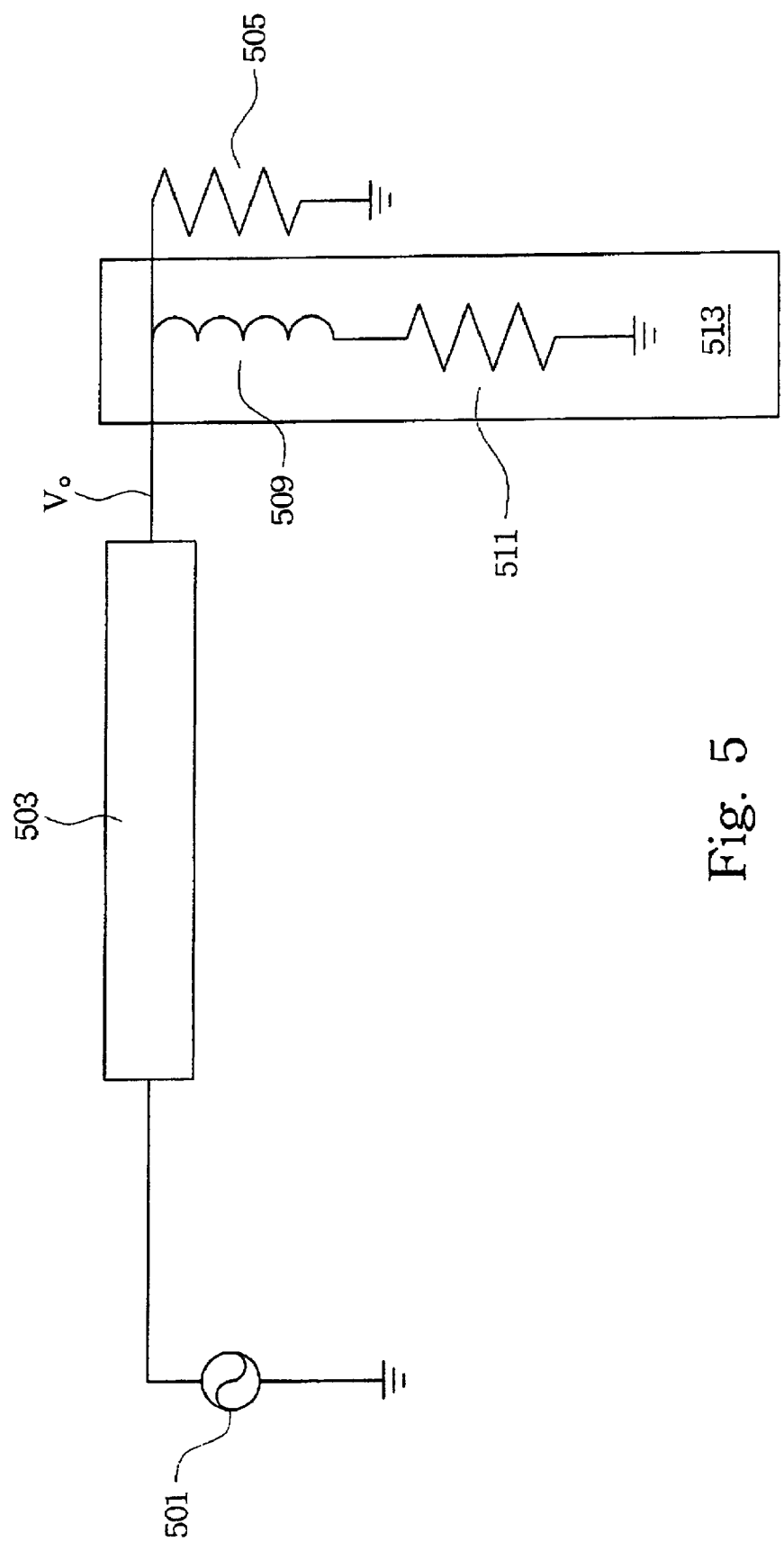
FIG. 5 shows the circuit of the transmission line and the equalizer according to another embodiment of the present invention.

FIG. 5 shows the circuit of the transmission line and the equalizer according to another embodiment of the present invention. The equalizer 513 is electrically connected to the transmission line 503, while the load 505 is electrically connected to the equalizer 513. The single ended signal 501 with 400 mv voltage and 5 Gbps frequency (period 200 ps) is transmitted by the transmission line 503 for simulation.

The equalizer 513 includes the inductor 509 and the resistor 511 in series connection. The scattering-parameter of the equalizer 513 is $$\frac{2(R_e + j2\pi fL_e)}{Z_0 + 2(R_e + j2\pi fL_e)},$$

in which the $R_e$ represents the resistance of the resistor 511, the $L_e$ represents the inductance of the inductor 509. The inductance $L_e$ and the resistance $R_e$, derived by processing the integration and the differentiation as stated above, are 7 nH and 29Ω respectively. To compensate for the signal losses caused by the transmission line more accurately, the inductance of the inductor 509 can be fine tuned from 7 nH to 10 nH, and the resistance of the resistor can be tuned from 29Ω to 30Ω.

Refer to the circuit simulation of the transmission line 503 and the equalizer 513, the eye height and the eye width of the compensated output signal $V_0$ are 154 mv and 180 ps respectively, while the eye height and the eye width of input single ended signal 501 are 400 mv and 200 ps respectively (The eye height and the eye width of the uncompensated output signal $V_0$ are 83 mv and 140 ps respectively). The eye height and the eye width of the compensated output signal $V_0$ are improved by 17.7% and 20%, respectively. Therefore, the equalizer can compensate the signal losses caused by the transmission line accurately.

According to the above embodiment, the method for manufacturing a equalizer can predict the required component impedance of the equalizer, which reduces the required simulation time; in addition, the method can compensate the signal losses caused by the transmission line more accurately.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing an equalizer used to compensate an output signal of a transmission line, wherein the equalizer is electrically connected to the transmission line, and a period signal with a $2\tau$ period is transmitted through the transmission line and the equalizer, the method comprising:

acquiring a transmission line scattering-parameter, and a gain of the transmission line scattering-parameter at a frequency $$\frac{1}{\pi\tau},$$

wherein the gain represents an ideal gain;

performing a integration about the transmission line scattering-parameter, the ideal gain and an equalizer scattering-parameter, and a differentiation about the transmission line scattering-parameter and the equalizer scattering-parameter to get the component impedances of the equalizer; and manufacturing the equalizer circuit with the derived component impedances.

2. The method of claim 1, wherein the integration derives the component impedances which make the gain of the output signal approach the ideal gain, and the differentiation derives the component impedances which make the slope of the gain of the output signal fixed at a frequency less than $$\frac{1}{\pi\tau}.$$

3. The method of claim 1, wherein the differentiation derives the component impedances which make the slope of the gain of the output signal less than zero at a frequency less than $$\frac{1}{\pi\tau}.$$

4. The method of claim 1, wherein the equalizer comprises an inductor and a resistor in series connection, and the equalizer scattering-parameter is $$H_{equalizer}(f) = \frac{2(R_e + j2\pi fL_e)}{Z_0 2(R_e + j2\pi fL_e)},$$

in which the $R_e$ represents the resistance of the resistor, $L_e$ represents the inductance of the inductor, and the $Z_0$ represents the resistance of a load electrically connected to the equalizer.

5. The method of claim 1, wherein the equalizer comprises an inductor, a capacitor, and a resistor, and the equalizer scattering-parameter is $$H_{equalizer}(f) = \frac{\frac{Z_0}{R_1} - 1 + 2j\sqrt{L_e C_e}\,\omega}{\frac{Z_0}{R_1} + 1 + 2j\sqrt{L_e C_e}\,\omega},$$

in which the $R_1$ represents the resistance of the resistor, the $C_e$ represents the capacitance of the capacitor, the $L_e$ represents the inductance of the inductor, the $Z_0$ represents the resistance of a load electrically connected to the equalizer, and the $\omega_c$ has the value equal to $$\frac{1}{\sqrt{L_e C_e}}.$$

6. The method of claim 1, wherein the integration is $$\int_0^\infty |(H_{TX-Line}(f) \times H_{equalizer}(f))| - H_{ideal}(f)|df = \min,$$

in which the $H_{TX-Line}(f)$ represents the transmission line scattering-parameter, the $H_{ideal}(f)$ represents the ideal gain, the $H_{equalizer}(f)$ represents the equalizer scattering-parameter, and the min represents the minimum positive number.

7. The method of claim 1, wherein the differentiation is $$\frac{d\{20\log_{10}[H_{TX-Line}(f) \times H_{equalizer}(f)]\}}{df} \leq 0,$$

$H_{TX-Line}(f)$ represents the transmission line scattering-parameter, $H_{equalizer}(f)$ represents the equalizer scattering-parameter.

8. The method of claim 1, further comprising processing a circuit simulation to confirm if the frequency response of the compensated output signal is as required.

9. The method of claim 1, wherein the period signal is a single ended signal.

10. The method of claim 1, wherein the period signal is a differential signal.

11. The method of claim 1, further comprising fine tuning the component impedances after the component impedances have been derived by the integration and the differentiation.

* * * * *